United States Patent [19]

Kubo

[11] Patent Number: 4,820,369
[45] Date of Patent: Apr. 11, 1989

[54] METHOD FOR REMOVING TOP TAPE ELEMENT FROM CHIP TAPE AND DEVICE THEREFOR

[75] Inventor: Masahiro Kubo, Sagamihara, Japan
[73] Assignee: Nitto System Technology Inc., Elk Grove Village, Ill.
[21] Appl. No.: 112,090
[22] Filed: Oct. 26, 1987
[30] Foreign Application Priority Data
Oct. 30, 1986 [JP] Japan .................................. 61-259558
[51] Int. Cl.⁴ ............................................. B32B 31/18
[52] U.S. Cl. .................................... 156/344; 156/259; 156/271; 156/584
[58] Field of Search ................ 156/259, 271, 344, 584
[56] References Cited
U.S. PATENT DOCUMENTS 1,323,212 11/1919 Bulley .............................. 156/271 X
3,033,741 5/1962 D'Amato et al. ................ 156/259 X
3,518,145 6/1970 Christensen ...................... 156/344 X
3,534,666 10/1970 Maccherone ..................... 156/344 X
4,196,040 4/1980 Houck ................................... 156/584

Primary Examiner—Robert A. Dawson
Attorney, Agent, or Firm—Oblon, Fisher, Spivak, McClelland & Maier

[57] ABSTRACT

A method for removing a top tape from a chip tape and a device therefor capable of facilitating start of the removing operation and positively accomplishing the removing operation efficiently. The device includes a guide shoe arranged at a predetermined position on a chip tape and provided with a tongue-like element which enters a gap between the chip tape and a top tape and a removal member which carries out one of peeling of the top tape from the chip tape and cutting of the top tape to remove the top tape from the chip tape. The method is practiced using the guide shoe.

4 Claims, 5 Drawing Sheets

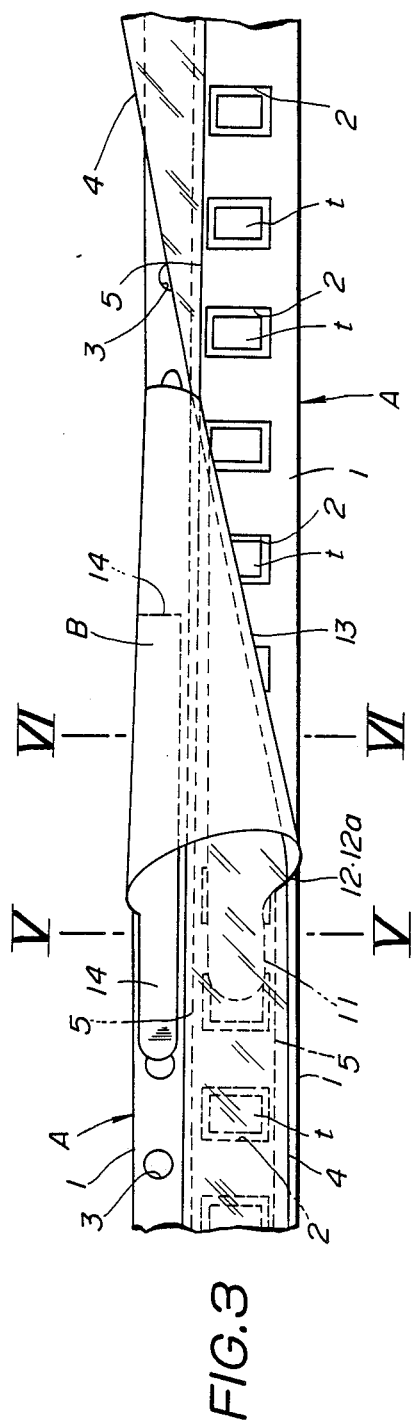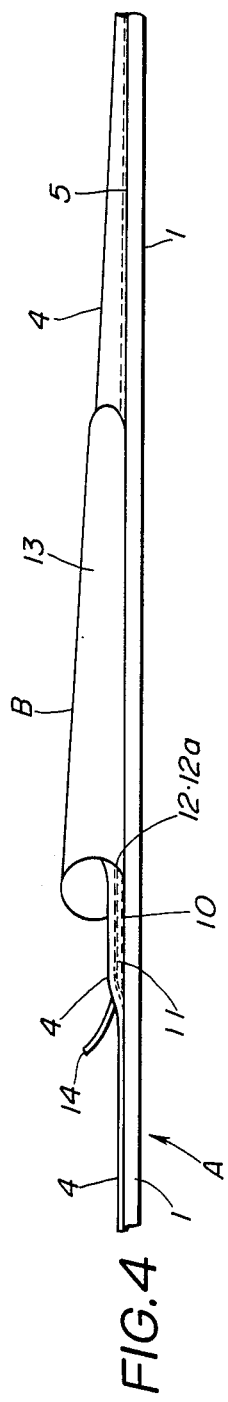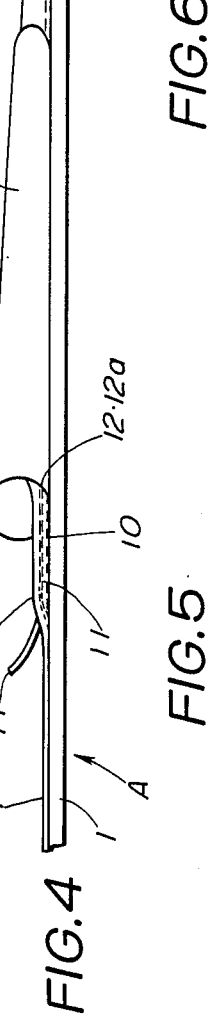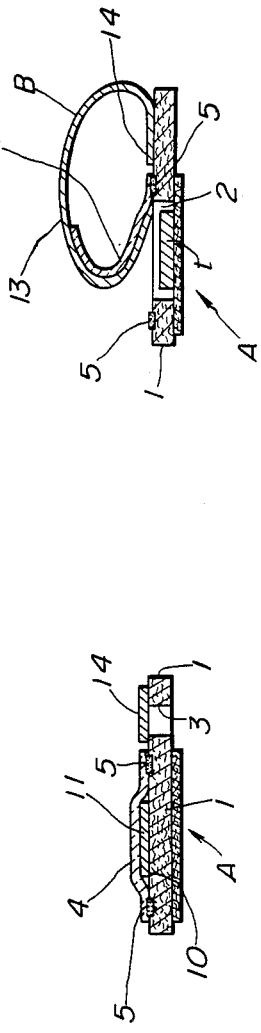

FIG.9
FIG.10
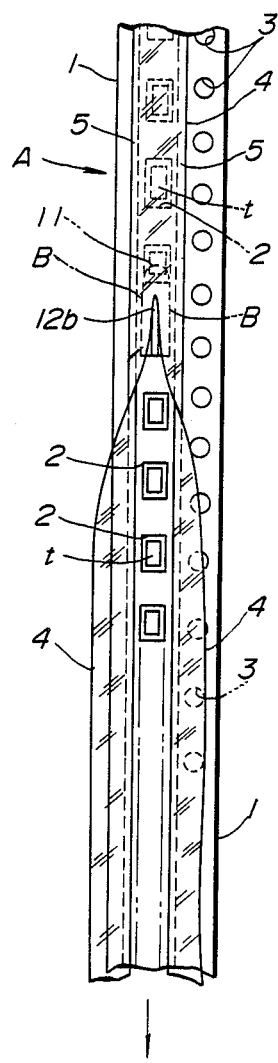
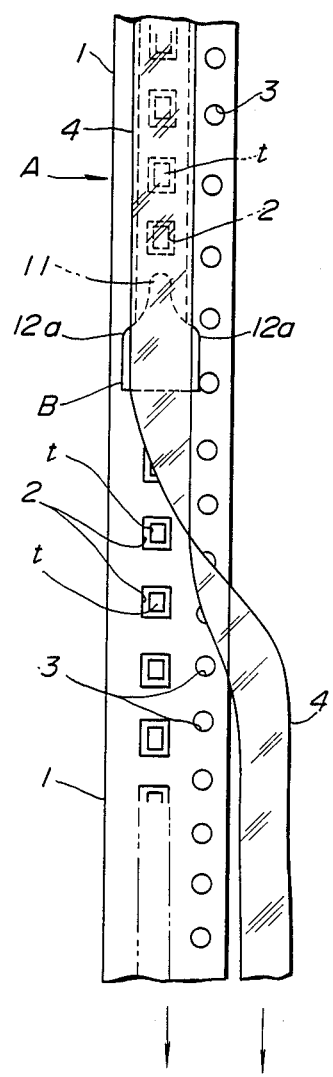

METHOD FOR REMOVING TOP TAPE ELEMENT FROM CHIP TAPE AND DEVICE THEREFOR

BACKGROUND OF THE INVENTION

1. Field of the Invention

This invention relates to a method for removing a top tape from a chip tape with which small-sized electronic circuit elements are charged and a device therefor, and more particularly to a method and a device for removal of a top tape from a chip tape with high accuracy and good efficiency before picking up the circuit elements from the chip tape, which facilitates disposal of the removed top tape.

2. Description of the Prior Art

A chip tape is extensively used in electronics industries. The chip tape comprises a tape such as a cardboard tape, an embossed plastic tape or the like charged with various kinds of small-sized electronic circuit elements (hereinafter referred to as "chips") at regular intervals.

The chip tape, as shown in FIG. 1 wherein the chip tape is generally indicated by reference character A, typically comprises a main tape element 1 formed of a cardboard of a small width and a continuous length and provided with chip receiving holes 2 and pitch holes 3 at uniform intervals, and a top tape element 4 and a bottom tape element arranged on surfaces of the main tape element 1 to seal the chip receiving holes 2 teerebetween along lines 5 which have chips t charged therein. The main tape element 1 may be formed of a plastic material, and the chip receiving holes 2 may be formed by embossing.

The chip tape A of a continuous length is wound into a reel-like shape and then received in a chip tape cassette. The chip tape A, as shown in FIG. 5, is then driven by successively engaging the pitch holes 3 with a suitable means such as a ratchet 6, a pawl lever 7 or the like, and is intermittently fed from the cassette by a predetermined length. Subsequently, the top tape element 4 is peeled from the main tape element 1 to successively expose the chips t received in the chip receiving holes 2, which are then taken out from the holes 2 in order by a suction head of an automatic chip mounting apparatus or the like and transferred to a subsequent chip mounting step.

Extraction of the chips t from the chip tape A requires peeling of the top tape element from the main tape element.

Conventionally, the peeling is carried out by manually peeling a leading portion of the top tape element 4 by a predetermined length and winding the peeled leading end on a take-up reel 8. The reel 8 is then rotated in synchronism with feeding of the chip tape A to accomplish peeling of the top tape element 4 from the main tape element 1 as well as winding of the main tape element 1 free of the top tape element 4. Alternatively, the peeling may be carried out utilizing by tension exerted by a pair of pressure feed rollers 9.

However, it was found that such conventional peeling as described above exhibits the following disadvantages.

One disadvantage is that replacement of the chip tape cassette or reel is highly troublesome and requires much time, because it needs operation of manually peeling the initial or leading end of the top tape and then winding the end on the take-up reel 8.

Another disadvantage encountered with the conventional peeling is that it requires to arranging the take-up reel 8 or a pair of the pressure feed rollers 9 so that it may be driven in synchronism with feeding of the chip tape A. As a result, it requires a sufficient space. Also, it is troublesome to adjust timing of the peeling and force required therefor, which causes problems such as a failure in the peeling, breakage of the top tape element and the like, and temporary interruption of an automatic chip mounting apparatus.

A further problem in the conventional peeling is that it requires disposal of the peeled top tape element such as the removal from the take-up reel by cutting or the like.

SUMMARY OF THE INVENTION

The present invention has been made in view of the foregoing disadvantages of the prior art.

Accordingly, it is an object of the present invention to provide a method for removing a top tape from a chip tape which is capable of facilitating starting of the removing operation.

It is another object of the present invention to provide a method for removing a top tape from a chip tape which is capable of positively accomplishing the removing operation efficiently.

It is a further object of the present invention to provide a method for removing a top tape from a chip tape which is capable of readily accomplishing disposal of a peeled top tape element with good efficiently.

It is still another object of the present invention to provide a device for removing a top tape from a chip tape which is capable of facilitating starting of the removing operation.

In accordance with one aspect of the present invention, a method for removing a top tape from a chip tape is provided. In the method, a guide shoe which is provided with a tongue-like element, is arranged at a position predetermined with respect to the chip tape. The chip tape is fed using a suitable means to cause the tongue-like element to enter a gap between the top tape and the chip tape. Then, the chip tape is successively fed to cause one of peeling of the top tape from the chip tape and cutting of the top tape to be carried out, which results in the top plate being removed from an upper surface of a chip receiving hole of the chip tape to expose chips charged in the chip receiving holes in order. The removed top tape is discharged in a forward direction for disposal together with or separate from the chip tape element which has been rendered empty.

In accordance with another aspect of the present invention, a device for removing a top tape from a chip tape is provided. The device includes a guide shoe arranged at a predetermined position on the chip tape which is fed by means of at least one of a ratchet and a pawl lever. The guide shoe is provided with a tongue-like element which enters a gap between the chip tape and the top tape when the tape is fed and removal means which carries out one of peeling of the top tape from the chip tape element and cutting of the top tape to remove the top tape from the chip tape.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIGS. 3 and 4 are an enlarged plan view and an enlarged front elevation view each showing an embodiment of a guide shoe according to the present invention and a manner of removal of a top tape element from a chip tape, respectively;

FIG. 5 is a sectional view taken along line V—V of FIG. 3;

FIG. 6 is a sectional view taken along line VI—VI of FIG. 3;

FIGS. 9 and 10 each are a plan view showing another manner of removal of a top tape element from a chip tape;

DETAILED DESCRIPTION OF THE PREFERRED EMBODIMENTS

Figure 1:
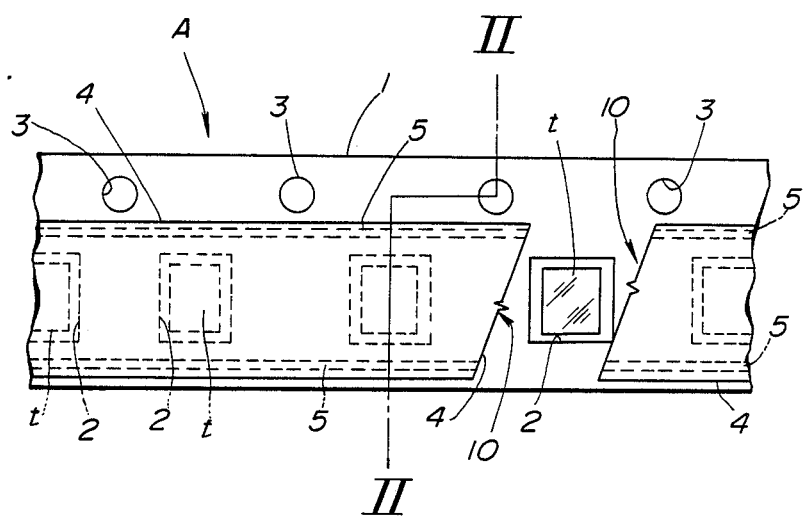
FIG. 1 is a fragmentary enlarged plan view showing an example of a chip tape which is treated by the present invention.

Now, the present invention will be described hereinafter with reference to the accompanying drawings.

The following description will be made in connection with the chip tape A briefly described above with reference to FIGS. 1 and 2. In the chip tape A, the top tape element 4 is sealed at both side sections thereof on the main tape element 1 along lines 5 so that an intermediate section thereof interposed between the sealed sections 5 may be separated from the main tape element 1 to define a gap 10 therebetween as shown in FIGS. 1 to 6.

In the present invention, a tongue-like element of a guide shoe is kept at a state of being inserted in the gap 10 while the chip tape A is fed so that the top tape element 4 may be successively peeled at least one of each sealed side sections 5 from the main tape element 1 or successively cut in a longitudinal direction thereof, during which the peeled top tape element 4 may be turned out. Thus, the top tape element 4 may be successively removed from the main tape element 1 to expose the chips t received in the main tape element 1 while the chip tape A is fed and then discharged in a forward direction. Thereafter, it is subjected to, for example, a winding treatment together with the main tape element which has been empty.

Now, a method of the present invention will be described.

In the method of the present invention, the chip tape A is forwarded to a guide shoe B arranged at a fixed position using a suitable means so that a tongue-like element 11 provided at the guide shoe 10 may enter the gap 10 between the top tape element 4 and the main tape element 1 while the chip tape A is forwarded. Then, the chip tape A is further forwarded, during which the guide shoe B successively peels the top tape element 4 from the main tape element 1 or cuts the top tape element 4 in a longitudinal direction thereof to remove it from the upper surface of the chip charging holes 2 to expose the chips t. The removed top tape element 4 is then discharged in a forward direction for disposal together with or separate from the main tape element 1 which has been rendered empty.

The guide shoe B may be arranged, for example, at a position on an upper surface of a portion of the chip tape A horizontally forwarded between the chip tape reel and the pawl lever 7.

Now, a device of the present invention will be described hereinafter.

The device of the present invention comprises the guide shoe B. The guide shoe B, as described above, is arranged at a fixed position on the upper surface of the chip tape A fed by the ratchet 6, the pawl lever 7 or the like.

The guide shoe B includes the tongue-like element 11 which is adapted to enter the gap 10 between the main tape element 1 and the top tape element 4. Also, the guide shoe B may be provided with a removal means 12 of any suitable structure for promoting peeling of the top tape element 4 from the main tape element 1 or cutting of the top tape element to remove it from the upper surface of the chip receiving holes 2. The removal means 12 may comprise a shoulder section 12a, a thick-wall section (not shown), a blade section 12b or the like which is formed at the guide shoe B.

The guide shoe B may be also provided with a guide means 13 of a suitable shape for turning out the peeled top tape element 4 or distributing it to at least one of both sides of the chip tape A or main tape element 1 and facilitating discharge of the top tape element 4 in the forward direction.

Further, the guide shoe A may be provided with a tape holding means 14 which is adapted to abut against an upper surface of a side section of the chip tape at which the pitch holes 3 are formed to press down it and guide feeding of the chip tape A.

Figure 2:
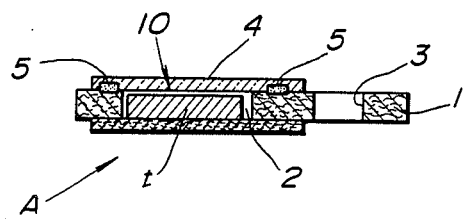
FIG. 2 is a sectional view taken along line II—II of FIG. 1.

Any construction of the guide means 13 and tape holding means 14 may be employed so long as it causes them to satisfactorily exhibit their function described above. For example, the guide shoe B, as shown in FIG. 2, may be formed into a substantially trancated conical shape having a gradually decreased diameter by sheet metal working, wherein the tongue-like element 11 is provided at a tip end of the guide shoe B, the shoulder section 12a is positioned subsequent to the tongue-like element 11 and an inner surface of the guide shoe B serves as the guide means 13. Also, the guide shoe B is formed on one side of the forward end thereof with the guide means 13 comprising an extension projected therefrom which is downwardly bent at an intermediate portion thereof and upwardly bent at a distal end thereof.

The thick-wall section may be formed at a portion of the guide shoe B positioned subsequent to the tongue-like element 11 in a manner to be somewhat upwardly projected therefrom. The thick-wall section of such construction effectively peels the top tape element from the main tape element when it is inserted into the gap 10 subsequent to the tongue-like element 11.

Now, the manner of operation of the device of the illustrated embodiment will be described hereinafter.

First, the chip tape A is desirably cut at a distal end thereof for facilitating insertion of the tongue-like element 11 into the gap 10. Then, the tongue-like element 11 of the guide shoe B is inserted into the gap 10 and the tape holding means 14 is pressedly contacted with the upper surface of the side section of the chip tape. Thereafter, feeding of the chip tape A is started.

The top tape element 4 of the chip tape A is peeled from the main tape element 1 or cut in the longitudinal direction by means of the guide shoe B while the chip tape is fed, which results in the top tape element 4 being separated from the upper surface of the chip receiving holes 2 to expose the chips t in order and concurrently discharged in the forward direction.

The exposed chips t are then picked up from the chip tape in order by means of a suction head of an automatic chip mounting apparatus for the mounting on a printed circuit board so that the main tape element 1 may be empty.

Then, the top tape element 4 removed from the main tape element 1 is turned out, distributed to at least one of both sides of the main tape element 1 or fully peeled therefrom and then subjected to disposal such as the winding on a reel together with or separate from the main tape element 1 which has been rendered empty.

Figure 7:
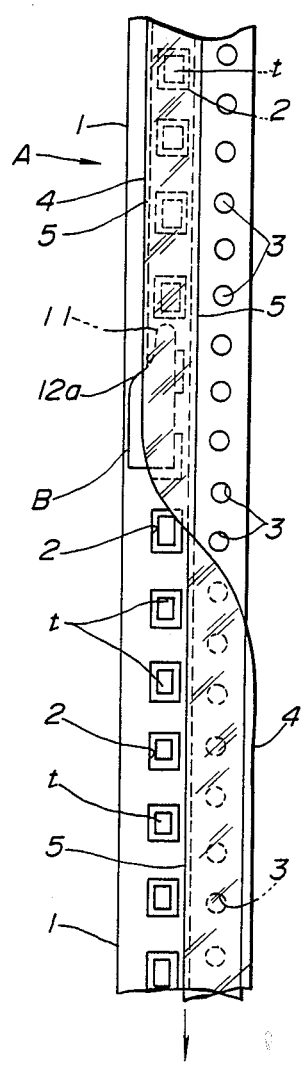
FIGS. 7 and 8 each are a plan view showing a manner of removal of a top tape element from a chip tape.

Removal of the top tape element 4 from the main tape element 1 may be carried out in a manner as shown in each of FIGS. 7 and 10.

FIG. 7 shows removal of the top tape element by means of the guide shoe B shown in FIG. 3, wherein the shoulder section 12a positioned adjacent to a left side of the tongue-like element 11 peels the top tape element 4 through only the left sealed ection 5 from the main tape element 1 and then the guide means 13 turns out the peeled top tape element 4 about the right sealed section 5 to cause it to be distributed to the pitch hole side of the chip tape A. Then, the top tape element 4 is discharged in the forward direction and subjected to winding operation together with the empty main.

Figure 8:
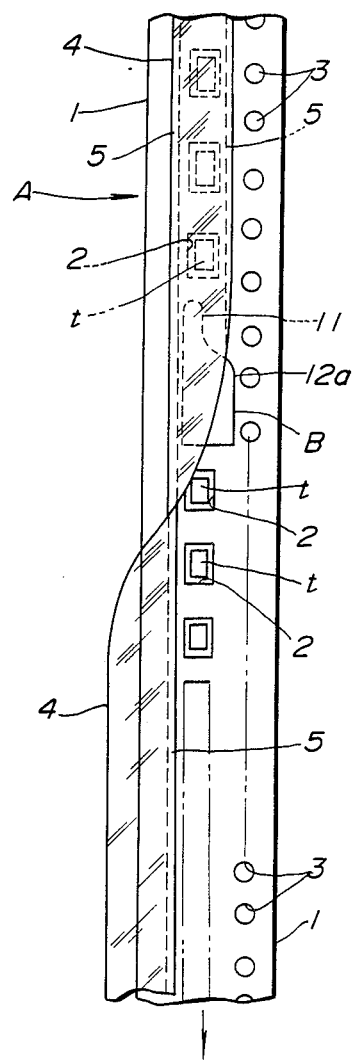
Figure 11:
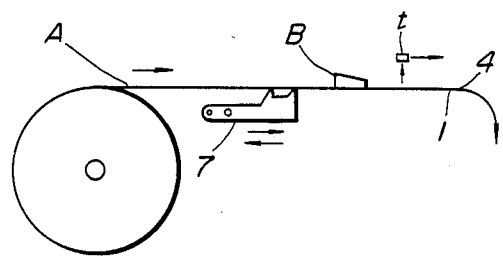
FIG. 11 is a schematic view showing operation of removing a top tape element from a chip tape by the present invention.
Figure 12:
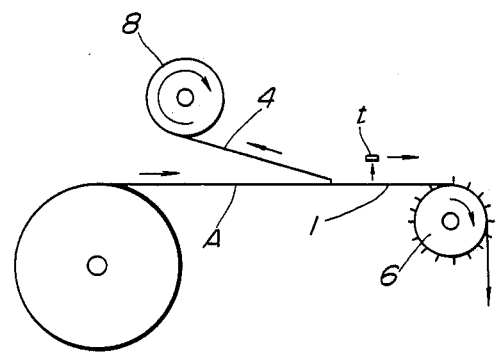
FIGS. 12 and 13 each are a schematic view showing operation of removing a top tape element from a chip tape by a prior art.
Figure 13:
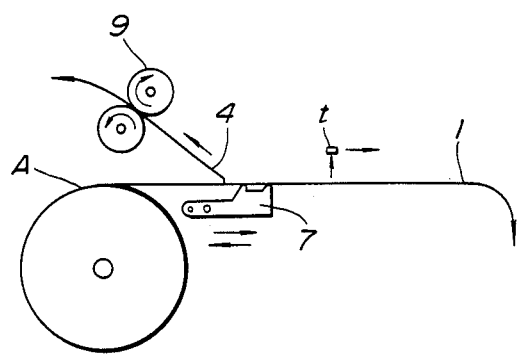

FIG. 8 shows removal of the top tape element 4 carried out in a manner such that the top tape element 4 is peeled through the right sealed section 5 from the main tape element 1 by means of the shoulder section 12a, turned out about the left sealed section 5, and distributed to the left side of the main tape element 1.

The removal shown in FIG. 9 is carried out in a manner such that the blade section 12b arranged behind the tongue-like element 11 cuts the top tape element 4 along an axis thereof, and then the cut tape element 4 is turned out to both sides of the main tape element 1 and discarged in the forward direction.

In FIG. 10, the shoulder sections 12a provided on both sides of the tongue-like element 11 peel the top tape element 4 from the main tape element 1 at both sealed sections 5, which is then turned out and discharged.

As can be seen from the foregoing, removal of the top tape element from the main tape element by the present invention is carried out in the manner that the tongue-like element of the guide shoe is inserted into the gap between both tape elements.

Accordingly, the present invention permits the removal to be positively accomplished with ease and good efficiency.

Also, the present invention permits setting and replacement of a chip tape cassette to be rapidly and readily carried out, because engagement between a chip tape received in the cassette and the guide shoe is made merely by inserting the tongue-like element into a gap at a tip end of the chip tape.

Further, the present invention eliminates any structure which has been conventionally required to drive a chip tape in synchronism with a ratchet or the like for disposal of a removed top tape element, such as a take-up reel, a pressure feed roller means or the like. Thus, in the present invention, it is merely required to arrange the guide shoe at a given position. This results in a chip tape cassette being highly simplified in construction and rendered thin. Accordingly, intervals between a plurality of chip tape cassettes arranged in parallel in an automatic chip mounting apparatus can be significantly decreased, which enables more chip tape cassettes to be arranged in the same space.

In addition, the present invention permits a proximal end of a chip tape to be connected to a distal end of the next chip tape so that chip tape feeding operation may be continuously carried out.

Furthermore, the present invention is practiced at a low cost because it is merely required to arrange the guide shoe at a given position.

While preferred embodiment of the invention have been described with a certain degree of particularity with reference to the drawings, obvious modifications and variations are possible in the light of the above teachings. It is therefore to be understood that within the scope of the appended claims, the invention may be practiced otherwise than as specifically described.

What is claimed as new and desired to be secured by Letters Patent of the United States is:

1. A method for removing a top tape element of a chip tape from a main tape element thereof, comprising the steps of:

arranging a guide shoe at a position predetermined with respect to said chip tape, said guide shoe being provided with a tongue-like element;

feeding said chip tape using a suitable means and causing said tongue-like element to enter a gap between said top tape element and said main tape element;

successively feeding said chip tape;

removing said top tape element from an upper surface of chip receiving holes of said main tape element to expose chips charged in said chip receiving holes; and discharging said removed top tape element.

2. A device for removing a top tape element of a chip tape from a main tape element thereof, comprising:

a guide shoe arranged at a predetermined position on said chip tape, said chip tape being fed by means of at least one of a ratchet and a pawl lever;

said guide shoe being provided with a tongue-like element which enters a gap between said main tape element and said top tape element and removal means for removing said top tape element from said main tape element.

3. A device as defined in claim 2, wherein said guide shoe is provided with a guide means which facilitates at least one of operation turning out said removed top tape element and operation of directing it to at least one of both sides of said chip tape for discharging it in a forward direction.

4. A device as defined in claim 2, wherein said guide shoe includes a tape holding means which abuts a side section of said chip tape at which pitch holes are formed in a row to guide feeding of said chip tape while pressing said chip tape.

* * * * *